United States Patent
Kumar et al.

(10) Patent No.: US 10,551,428 B2
(45) Date of Patent: Feb. 4, 2020

(54) SYSTEMS AND METHODS FOR STORING FREQUENCY INFORMATION FOR SYSTEM CALIBRATION/TRIMMING

(71) Applicant: Microchip Technology Incorporated, Chandler, AZ (US)

(72) Inventors: Ajay Kumar, Phoenix, AZ (US); Hyunsoo Yeom, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 189 days.

(21) Appl. No.: 15/685,570

(22) Filed: Aug. 24, 2017

(65) Prior Publication Data

US 2018/0059171 A1  Mar. 1, 2018

Related U.S. Application Data

(60) Provisional application No. 62/379,632, filed on Aug. 25, 2016.

(51) Int. Cl.
| | | |
|---|---|---|
| *G01R 31/28* | (2006.01) | |
| *H03L 1/00* | (2006.01) | |
| *H03L 1/02* | (2006.01) | |
| *H03L 7/02* | (2006.01) | |

(52) U.S. Cl.
CPC ..... *G01R 31/2824* (2013.01); *G01R 31/2837* (2013.01); *H03L 1/00* (2013.01); *H03L 1/021* (2013.01); *H03L 1/026* (2013.01); *H03L 7/02* (2013.01); *H03J 2200/01* (2013.01); *H03J 2200/10* (2013.01); *H03K 2217/94031* (2013.01)

(58) Field of Classification Search
CPC .............. H03L 1/021; H03L 1/00; H03L 7/02
See application file for complete search history.

(56) References Cited

U.S. PATENT DOCUMENTS

| | | | | |
|---|---|---|---|---|
| 6,813,529 | B2* | 11/2004 | Hedley | H04Q 1/4575 |
| | | | | 379/386 |
| 8,390,384 | B1* | 3/2013 | Daryanani | H03L 1/026 |
| | | | | 331/111 |
| 2007/0155341 | A1* | 7/2007 | Haiut | H03L 1/026 |
| | | | | 455/75 |
| 2009/0058540 | A1* | 3/2009 | Leatherman | G01R 31/2884 |
| | | | | 331/57 |

(Continued)

FOREIGN PATENT DOCUMENTS

| | | | | |
|---|---|---|---|---|
| WO | 2012/137590 A1 | 10/2012 | ............ | H01L 21/822 |
| WO | 2013/078108 A2 | 5/2013 | ............... | H03L 7/00 |
| WO | 2013/116441 A1 | 8/2013 | .............. | G04F 10/10 |

OTHER PUBLICATIONS

International Search Report and Written Opinion, Application No. PCT/US2017/048574, 17 pages, dated Dec. 12, 2017.

*Primary Examiner* — Alvaro E Fortich
(74) *Attorney, Agent, or Firm* — Slayden Grubert Beard PLLC

(57) ABSTRACT

Embodiments of the present disclosure include a microcontroller with a frequency test circuit, a device-under-test (DUT) input, and a calculation engine circuit. The calculation engine circuit is configured to compare a measured frequency from the frequency test circuit measured from the DUT input to a reference frequency stored in memory, and, based on the comparison, adjust frequency of the DUT generating the DUT input.

22 Claims, 4 Drawing Sheets

(56) References Cited

U.S. PATENT DOCUMENTS

| | | | |
|---|---|---|---|
| 2010/0244969 A1* | 9/2010 | Tsai | H03L 1/023 |
| | | | 331/66 |
| 2012/0086482 A1* | 4/2012 | Maheshwari | H03L 7/0998 |
| | | | 327/156 |
| 2013/0154699 A1* | 6/2013 | Tokunaga | H03K 4/501 |
| | | | 327/157 |
| 2015/0249453 A1* | 9/2015 | Harrington | G01R 23/02 |
| | | | 331/44 |
| 2016/0241186 A1* | 8/2016 | Motz | G01D 3/02 |

* cited by examiner

SYSTEMS AND METHODS FOR STORING FREQUENCY INFORMATION FOR SYSTEM CALIBRATION/TRIMMING

RELATED APPLICATIONS

This application claims priority to U.S. Provisional Application No. 62/379,632, filed Aug. 25, 2016, the contents of which are hereby incorporated in their entirety.

FIELD OF THE INVENTION

The present disclosure relates to oscillators and, more particularly, systems and methods for storing frequency information for oscillator calibration and trimming.

BACKGROUND

An electronic oscillator generally includes a resonant circuit that produces a periodic, time-varying electrical signal of a given frequency. The inverse of the resonant circuit's period determines its frequency. The electrical signal may be used, for instance, to keep track of the passage of time by counting several signal oscillations. A common electronic oscillator employs a quartz crystal as its resonating element, although other types of piezoelectric materials (e.g., polycrystalline ceramics) may also be used.

Electronic oscillators are used to generate clock signals for lots of electronic devices. Electronic oscillators are an important component of radio frequency (RF) and electronic devices. Often, oscillator circuitry is provided on an electronic device.

SUMMARY

Figure 1:
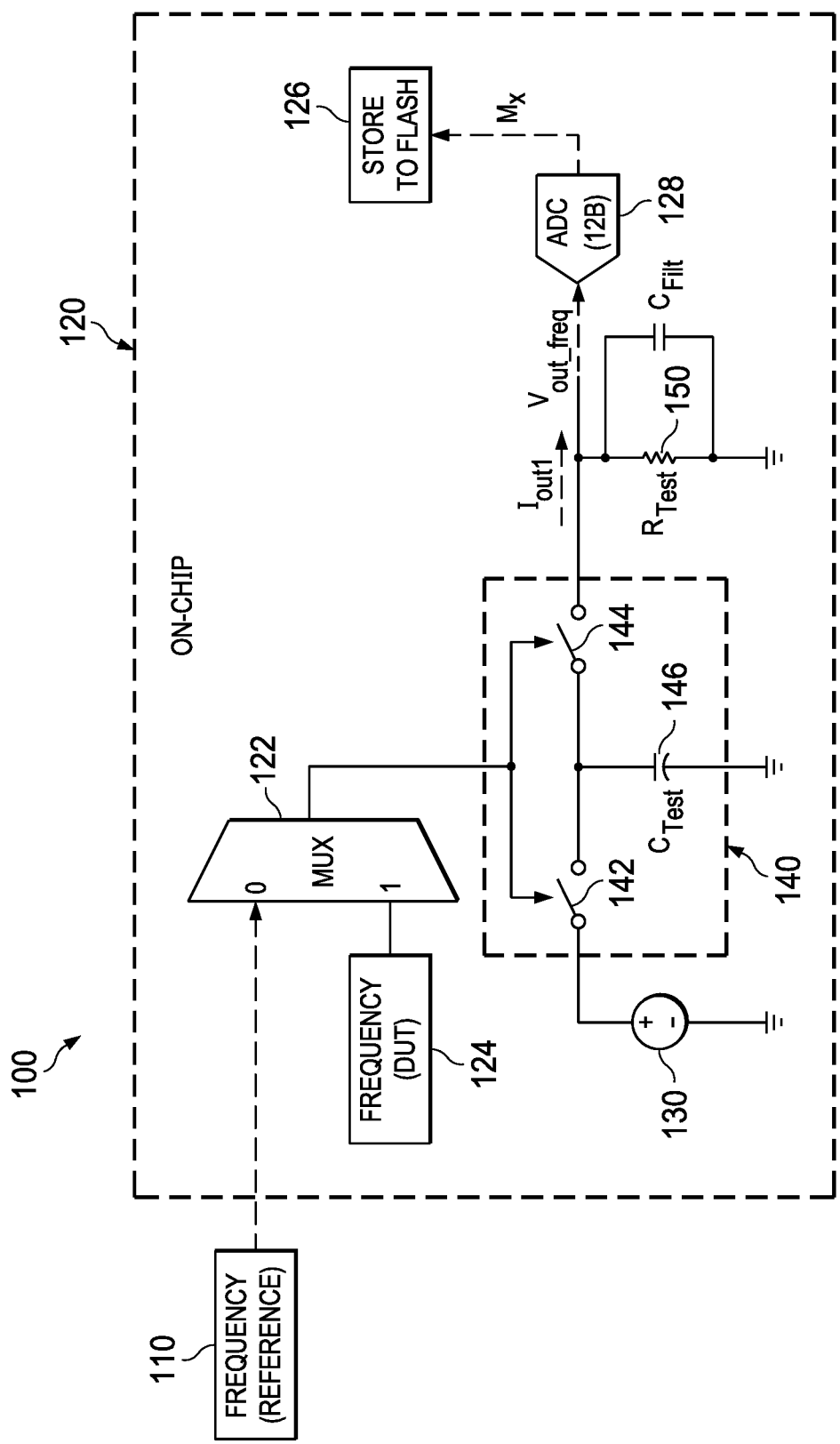
FIG. 1 is a block diagram illustrating an example circuit for storing reference frequency, per embodiments of the present disclosure.

In accordance with one aspect of the disclosure, an integrated circuit is provided. The integrated circuit includes an oscillator circuit. The circuit system includes a digital code generator coverts a reference frequency input to a first digital code and a testing frequency from the oscillator circuit to a second digital code.

In accordance with another aspect of the disclosure, a method is provided for operating an integrated circuit. The method includes following acts. First, the circuit system measures and stores a first product of current and resistor values at a first temperature. The circuit system measures and stores a second product of current and resistor values at a second temperature. The circuit system measures and stores a first digital code for a desired frequency before packaging. The circuit system measures and stores a second digital code after packaging. The circuit system calculates the package stress ratio and corrects the oscillator output by using the first and second digital codes.

Embodiments of the present disclosure include an integrated circuit including a frequency test circuit, a device-under-test (DUT) input and a calculation engine circuit configured to compare a measured frequency from the frequency test circuit measured from the DUT input to a reference frequency stored in memory based on the comparison, adjust frequency of the DUT generating the DUT input. In combination with any of the above embodiments, the integrated circuit may further include one or more switches and a capacitor. In combination with any of the above embodiments, the frequency test circuit may be configured to operate the switches according to a frequency of the DUT input. In combination with any of the above embodiments, the integrated circuit may further include an analog-to-digital converter (ADC). In combination with any of the above embodiments, the frequency test circuit may be configured to operate the switches according to frequency of the DUT input. In combination with any of the above embodiments, the frequency test circuit may be configured to output a voltage resulting from operation of the switches according to frequency of the DUT input, and the voltage output to the ADC. In combination with any of the above embodiments, the ADC is configured to output the measured frequency from a conversion of the voltage. In combination with any of the above embodiments, the calculation engine circuit may be further configured to adjust frequency of the DUT based upon a stress ratio stored in memory reflecting a status of the integrated circuit before and after packaging. In combination with any of the above embodiments, the calculation engine may be further configured to adjust frequency of the DUT based upon a temperature ratio stored in memory reflecting a temperature performance curve. In combination with any of the above embodiments, the integrated circuit may further include a reference frequency input and a multiplexer configured to select between the DUT input and the reference frequency input to be applied to the frequency test circuit. In combination with any of the above embodiments, when the reference frequency input is selected, the frequency test circuit may be configured to store a resulting measurement to memory. In combination with any of the above embodiments, the frequency test circuit may be configured to store a resulting measurement of the reference frequency input to memory based upon a selection of the reference frequency input. In combination with any of the above embodiments, the frequency test circuit may be configured to provide a resulting measurement of the DUT input to the calculation engine circuit based upon a selection of the DUT input. Embodiments of the present disclosure may include microcontrollers including any of the integrated circuits described above. Embodiments of the present disclosure may include methods performed by any of the microcontrollers or integrated circuits described above.

The foregoing and other advantages of the disclosure will appear from the following description.

DETAILED DESCRIPTION

The present disclosure describes systems and methods for storing frequency information on silicon in digital codes and then retrieving the frequency information and using the retrieved information to perform on-the-fly trimming tests in the field. The present systems and methods can be implemented in integrated circuits to reduce trimming test time from a few milliseconds to less than 0.08 milliseconds, resulting in improved oscillator calibration in less time as compared to conventional calibration methods.

Mechanical stresses may influence the frequency stability of oscillators. For example, the stresses can be induced by mounting, bonding, and application of the electrodes; by differential thermal expansion of the mounting, electrodes, and the crystal itself; by differential thermal stresses when there is a temperature gradient present; by expansion or shrinkage of the bonding materials during curing, by the air pressure that is transferred to the ambient pressure within the crystal enclosure, by the stresses of the crystal lattice itself (nonuniform growth, impurities, dislocations), by the surface imperfections and damage caused during manufacture, and by the action of gravity on the mass of the crystal. Thus, the frequency can vary before and after packaging. The variations of frequency can cause the oscillator and the overall circuit to operate outside of desired specifications.

On-chip oscillators typically undergo calibration to address the frequency variations induced by packaging and PCB-related stresses. Commonly, pre- and post-packaging silicon trimming tests are performed to ensure accuracy at multiple temperatures. A trimming test may require 1000 cycles of waiting time to achieve the required accuracy. These test steps can take a few milliseconds that increase the total production cost of oscillators. Additionally, the test requires an accurate reference frequency, which makes it infeasible for on-the-fly testing and trimming in the field. Thus, it is desirable to calibrate the oscillators more efficiently.

FIG. 1 is a block diagram illustrating an example integrated circuit 100, according to embodiments of the present disclosure. Circuit 100 may represent operation for storing frequency information for system calibration and trimming during a production or production test phase. Some portions of circuit 100 may also be used for operation by circuit 100 for storing frequency information for system calibration and trimming during a phase of end user use or deployment in the field. Such portions may include chip 120. Such operation may be described in more detail in FIG. 4.

Integrated circuit 100 may include a chip 120 including an analog-to-digital converter (ADC) 128 and a storage 126. ADC 128 may be implemented using any suitable combination of analog and digital circuitry. Storage 126 may be implemented by, for example, a silicon or other semiconductor-based flash memory or another suitable type of memory, magnetic disk storage, and the like. Integrated circuit 100 includes a device under test (DUT) 124, which may be a crystal oscillator, an RC oscillator, another type of oscillator, or another clocking device that produces an output signal encoding a frequency Fosc. DUT 124 may provide the signal comprising the DUT's 124 frequency to a multiplexer (mux) 122 on chip 120. DUT 124 may be included in or communicatively coupled to, for example, a microcontroller.

A reference frequency generator 110 may be configured to provide a signal encoding a consistent reference frequency FREF to the mux 122. Reference frequency generator 110 may be a component of the circuit 100, or may be an external device temporarily connected to the mux 122 during calibration procedures. Such calibration procedures may be performed, for example, during production or production test. Reference frequency generator 110 may be implemented by any suitable analog or digital circuitry, such as a known RC oscillator or another frequency source with a trusted frequency. The reference frequency FREF may be the expected or desired frequency of the DUT 124.

Mux 122 may be configured to output one of its inputs. In one case, mux 122 may be configured to output the value of reference frequency generator's 110 output signal. In another case, mux 122 may be configured to output the value of DUT 124 output signal. Mux 122 may be controlled by instructions, controls signals, or other mechanisms on chip 120. Mux 122 may be controlled according to whether chip 120 is in a production environment or an end-user environment. In a production environment, including a production or production test situation, mux 122 may be controlled so as to output the value of reference frequency generator's 110 output signal. In such a case, the response of the rest of chip 120 may be stored in storage 126. In an end user environment, mux 122 may be controlled so as to output the value of reference frequency generator's 110 output signal. In such a case, the response of the rest of chip 120 during production or production test may be retrieved from storage 126 and used to trim the frequency of DUT 124 on-the-fly.

The output of mux 122 may be supplied to switches 142, 144 of a switched-capacitor (SC) circuit 140. SC circuit 140 may also include a capacitor 146 (CTEST) connected to ground. SC circuit 140 may also be connected to an input power source (voltage reference) 130. Power source 130 may be implemented in any suitable manner, such as a voltage source, voltage generator, current generator, or other suitable combination of analog and digital circuitry. The output of mux 122, whether from DUT 124 or reference frequency generator 110, may be cyclical with a frequency corresponding to the selected input. The output of mux 122 may act as an on-off signal, even though the output of mux 122 may be a square wave, sine wave, or other periodic signal. The frequency of the output of mux 122, whether from DUT 124 or reference frequency generator 110, may cycle switches 142, 144 on and off at the frequency of the output of mux 122 and result in a given level of output. The given level of output may be expressed as an output current or an output voltage. Thus mux 122 output closes and opens switches 142, 144 at the frequency encoded in the selected signal (either FREF or Fosc), charging and discharging capacitor 146 so that the current Iout1 delivered to ADC 128 is pulsed at the corresponding frequency. The product of switching current Iout1 and RTEST can be stored into Cfilt to take the average of the product before feeding into the ADC.

The output of SC circuit 140 may be coupled to ADC 128. In one embodiment, the output of SC circuit 140 may also be coupled to a resistor (RTEST) 150. Resistor 150 may include a theoretical resistance value and may produce a voltage drop with a theoretical value that is product of Iout1 and RTEST. The product of Iout1 and RTEST can be averaged by Cfilt. This may generate a signal (Vout_freq) received by ADC 128. Accordingly, the ADC 128 outputs a value in digital bits that is the analog to digital conversion of the received Vout_freq. This value may be a digital code Mx that corresponds to the received frequency. ADC 128 may be configured to send or write the digital code to storage 126.

Accordingly, SC circuit 140 and ADC 128 work together as a digital code generator to convert a frequency signal to a digital code, wherein the frequency signal may be a reference frequency (such as the output of reference frequency generator 110, FREF) or a testing frequency (from DUT 124, Fosc). The digital code may be saved as a binary digital code with any suitable length, such as twelve bits.

The length of the digital code may be changed if needed and may be dependent upon the implementation of ADC 128.

When mux 122 selects the frequency input from reference frequency generator 110, the measurement network comprising power source 130, SC circuit 140, resistor 150, a capacitor (Cfilt) and ADC 128 produces a digital code for the reference frequency FREF. When mux 122 selects the frequency input from DUT 124, the same measurement network will produce a digital code for the OUT frequency Fosc. When the frequency input from DUT 124 is the same as the reference frequency, the resulting digital codes are the same. In some cases, given the granularity of the ADC conversion, the resulting digital codes for a nearly the same frequency may be different, plus or minus a bit. When the DUT frequency is different from the reference frequency, different digital codes may be generated by ADC 128 for the respective frequencies.

However, the actual resistance of resistor 150 may also be affected by packaging stresses and other stress as described above with respect to the oscillator. Deviations from RTEST can affect the input signal to ADC 128 and cause an incorrect digital code to be produced. Embodiments of the present disclosure may thus be configured to compensate for package stress on the resistor 150 by measuring the resistance.

Figure 2:
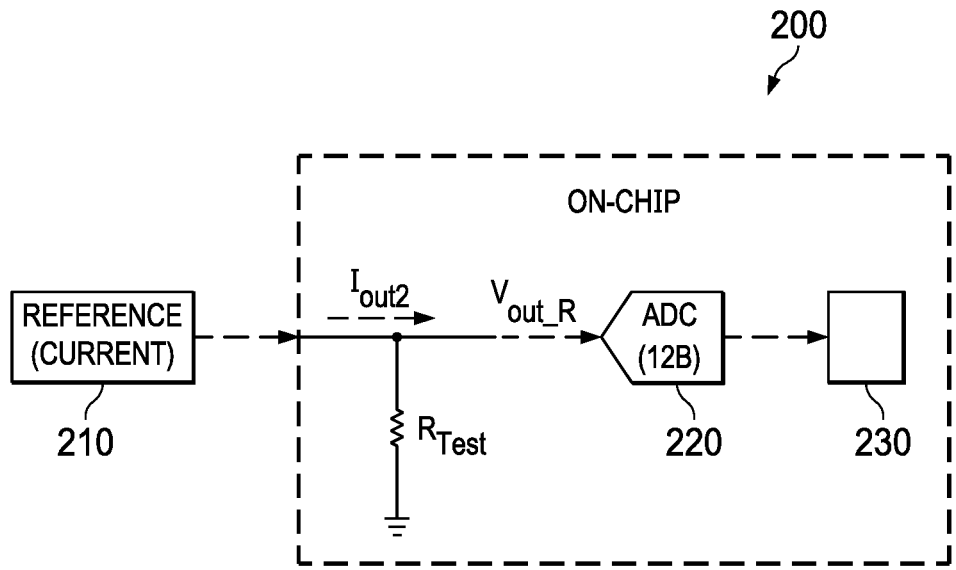
FIG. 2 is a block diagram illustrating a circuit for storing resistance variation, per embodiments of the present disclosure.

FIG. 2 illustrates an embodiment of a circuit 200 for storing resistance variation, according to embodiments of the present disclosure. Operation of circuit 200 may be performed during production or production test. Circuit 200 may be operated both before and after packaging to encapsulate chip 120. Chip 200 may implement a portion of chip 120.

Circuit 200 may include a current source 210 configured to generate a reference current to the chip, though any suitable power source may be used. Current source 210 may be configured to send a current output Iout2 so that a resistor of actual resistance RTEST (i.e., the resistor 150 of FIG. 1) will generates a voltage Vout_R at an ADC 220. In turn, ADC 220 may be configured to produce a digital code encoding ADC 220 input (as described above), and to store the digital code in flash memory or another storage 230. Storage 230 and ADC 220 may implement the storage and ADC of FIG. 1, or may be implemented in a similar manner as the storage and ADC of FIG. 1.

A first digital code M1 may be generated in circuit 200 and stored in storage 230 prior to wafer packaging. A second digital code M2 may be generated in circuit 200 and stored in storage 230 after wafer packaging.

Thus, a package stress ratio η1 may be calculated by dividing M1 by M2, or vice versa. A system implementing circuit 100 of FIG. 1 may use ill to compensate for package stress on the resistor therein when determining the frequency shift of the voltage output caused by package stress. The circuit 200 of FIG. 2 may be combined with the circuit 100 of FIG. 1. Alternatively, the circuit 200 of FIG. 2 may use part of the circuitry on the chip 120 in FIG. 1 to generate two additional digital codes M1 and M2 encoding the pre-package and post-package resistance values of a resistor (e.g., resistor 150). A system implementing circuit 100 may, during run-time application to evaluate frequencies of DUT 124, multiply the voltage output (whether as input to or output from ADC 128) times the package stress ratio η1. The package stress ratio η1 may thus be determined during production, while calculated from two such stages during production.

Figure 3:
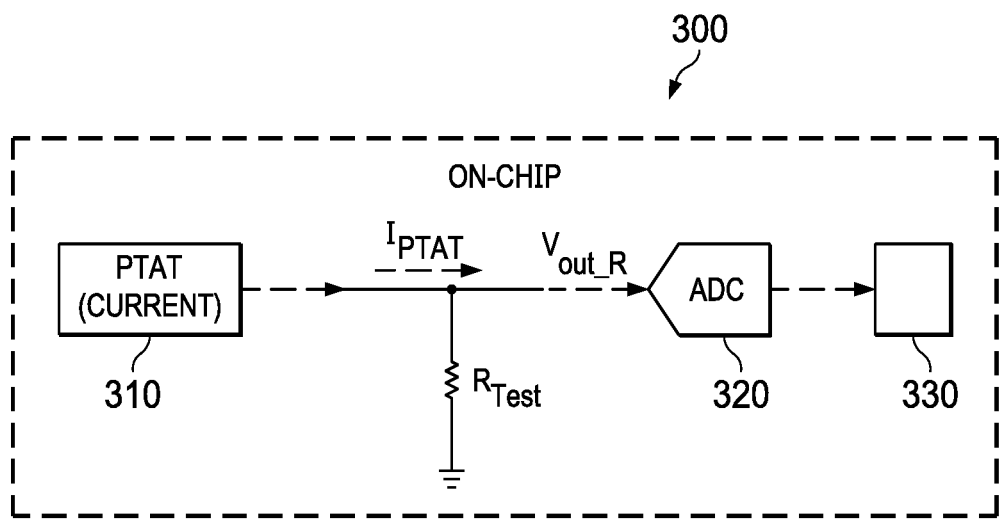
FIG. 3 is a block diagram illustrating a circuit for storing proportional to absolute temperature (PTAT) variation over temperature, per embodiments of the present disclosure.

FIG. 3 is a third block diagram illustrating an additional or alternative circuit 300 to circuit 200 of FIG. 2, according to embodiments of the present disclosure. Circuit 300 may be configured to measure the voltage slope of the temperature variation using a current source 310 that experiences a proportional to absolute temperature (PTAT) variation of the current. PTAT variation may describe the degree to which performance may change while temperature changes. Circuit 300 may include a current source 310. Current source 310 may be a PTAT current source disposed inside the chip that includes an oscillator. For example, the PTAT current source may include one or more circuit components using complementary metal-oxide-semiconductor (CMOS). That is, the output current IPTAT of current source 310 may change linearly over a temperature range. The variable current IPTAT causes the resistor RTEST to bear a voltage VouT_R so that ADC 320 generates different digital codes for different temperatures, storing generated codes in flash memory or other storage 330.

For example, during production or production test, circuit 300 may be configured to store a digital code M3 that indicates the voltage of IPTAT applied on RTEST at a first temperature. Circuit 300 may be configured to store a fourth digital code M4 that indicates the voltage of IPTAT applied on RTEST at a second temperature. Thus, the system may calculate a PTAT ratio η2 by dividing M3 by M4 or vice-versa.

The system may later, by an end user, use the PTAT ratio η2 to compensate the frequency shift in RC-oscillator caused by temperature changes. A system implementing circuit 100 may, during run-time application to evaluate frequencies of DUT 124, multiply the voltage output (whether as input to or output from ADC 128) times the PTAT ratio η2. The PTAT slope ratio η2 may thus be determined during production, while calculated from two such stages during production. The ratio η2 may be used when, in application of circuit 100, the temperature reaches the temperature used to find M4. The temperature at which M3 was determined may have been the temperature at which codes were stored for circuit 100. Thus, applying the ratio η2 to a voltage yielded from a tested frequency may factor in a change in temperature reflected by the differences of temperatures used to find M3 and M4. Multiple instances of η2 may be tested and stored, wherein different possible temperatures at which circuit 100 is used during applications may be stored via memory codes corresponding to the different changes. A system implementing circuit 100 may, during run-time application to evaluate frequencies of DUT 124, multiply the voltage output (whether as input to or output from ADC 128) times the ratio η2.

As an example of operation, circuit 300 may be executed once with a PTAT corresponding to 25° C. The resulting code may be stored in storage as M3. Circuit 300 may be executed subsequently with a PTAT corresponding to 85° C. The resulting code may be stored in storage as M4. The ratio η2=M3/M4 for the particular instance of RTEST and ADC 320 may be stored in storage.

Figure 4:
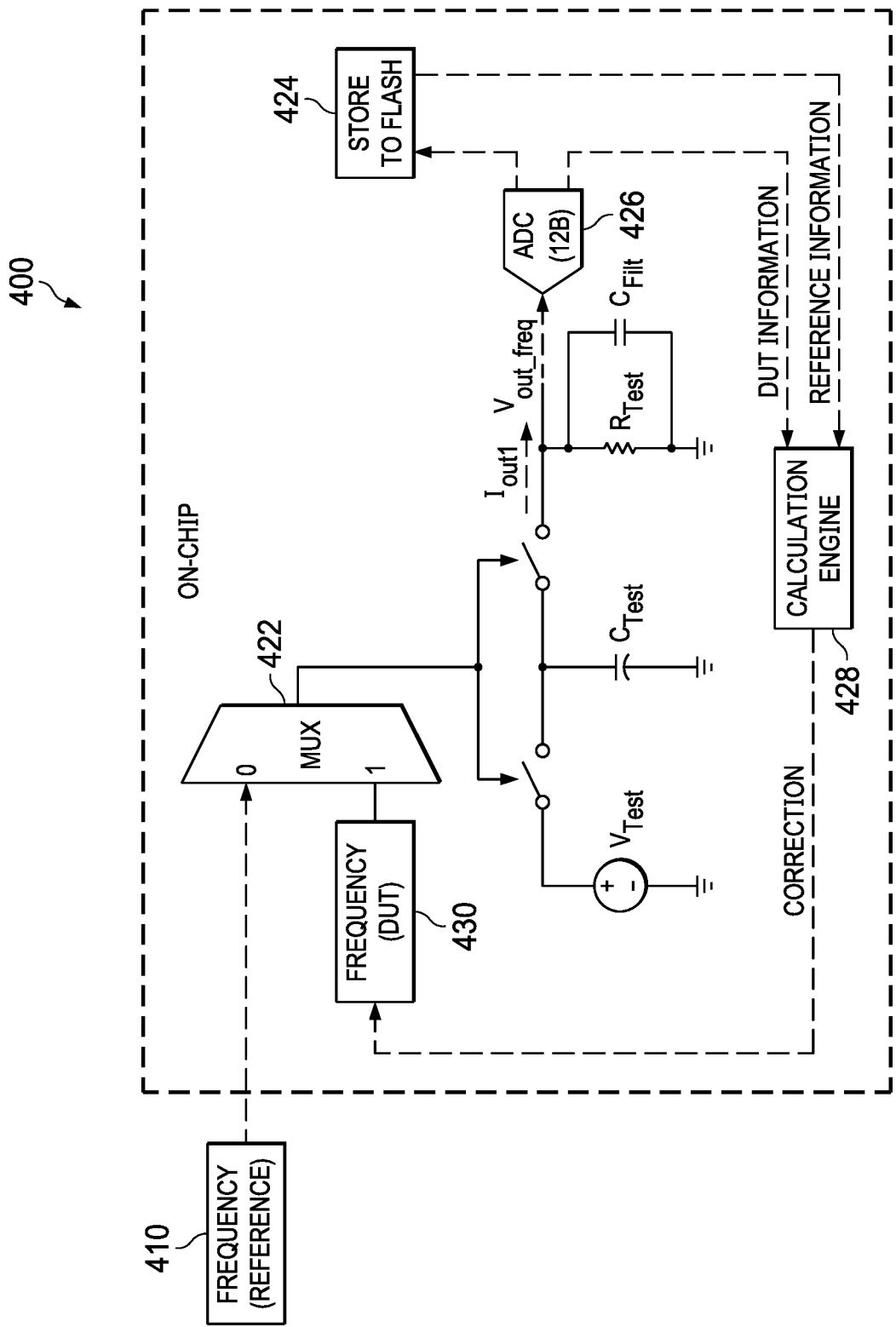
FIG. 4 is a fourth block diagram illustrating a circuit for on-the-fly frequency correction, per embodiments of the present disclosure.

FIG. 4 is a block diagram illustrating a circuit 400 for on-the-fly frequency correction of an oscillator in a deployed chip, according to embodiments of the present disclosure. Circuit 400 may implement circuit 100. In one embodiment, circuit 400 may be the same as circuit 100, but in a post-production deployed chip.

Circuit 400 may include or be coupled to a frequency source 410 that generates a reference frequency to a mux 422. In a deployed chip, frequency source 410 might be omitted or not used in particular circumstances. In such a case, such an input to mux 422 might be ignored and the other input used. A DUT 430 may provide a frequency input to the mux 422. Circuit 400 may include a storage 424 that stores the one or more digital codes disclosed above. ADC 426 may be configured to covert the voltage signal Vout_freq applied on RTEST to a digital code, as described above.

Circuit 400 may operate similarly to circuit 100 of FIG. 1. Circuit 400 may include a calculation engine 428. Calculation engine 428 may be implemented with digital circuitry, analog circuitry, or circuitry for executing instructions by a processor, or any combination thereof. Calculation engine 428 may be configured to accept as input a present value of DUT 430 frequency. Furthermore, calculation engine 428 may be configured to accept as input a reference value of a frequency stored in storage 424 that represents the digital code of a known reference frequency previously stored. Such a digital code may include the code of the reference frequency source in FIG. 1 and stored during production or production test. Although not shown, calculation engine 428 may also accept ratios η1 or η2 to account for stress changes or temperature changes. These may have been stored in storage 424 as well.

Calculation engine 428 may be configured to provide a feedback correction signal to DUT 430 based upon its inputs. The feedback correction signal may include trimming or trim bits. A controller for DUT 430 may accept trim bits that may adjust the frequency of DUT 430 up or down according to an amount based upon an available number of bits. The number of trimming bits may vary according to the implementation of DUT 430.

Calculation engine 428, given a difference between a digital code of the reference frequency and a digital code of the actual frequency of DUT 430, may adjust the feedback correction signal to DUT 430 iteratively. The iterative process of changing the frequency of DUT 430, measuring the next differential between the a digital code of the reference frequency and a digital code of the actual frequency of DUT 430, and making a subsequent change to the frequency of DUT 430 may be performed in any suitable way. For example, the iterative process may mirror that of a binary search, heap search, bubble search, or other suitable algorithm. An initial measurement of the differential frequency may be evaluated and the frequency may be adjusted according to half of the range of possible trimming between the present value and a maximum or minimum value. A subsequent measurement of the differential frequency may be evaluated and the frequency may be adjusted according to half of the range of possible trimming between the present value and a minimum/maximum value and the previous value. Calculation engine 428 may iterate adjustments for a fixed number of cycles, until a minimum error is met, continuously, or any other suitable criteria.

Circuit 400 may thus correct frequency on-the fly by using the frequency locking loop that compares the reference information and the OUT information and outputs a correction signal containing instructions for the DUT 430 to correct for the difference between the two codes. When the two digital codes are, equal or meet a preset condition, the frequency is determined to be correct.

Circuit 400 may be operated in use cases such as end users to provide just-in-time or on-the-fly trimming during operation. The frequency used to power the SC circuit may be the changing, variable frequency of DUT 430. Circuit 100 may be operated in use cases such as production or production test. The frequency used to power the SC circuit may be the known, set reference frequency that is stored.

Consequently, a system that operates its circuits according to FIGS. 1-4 for trimming may successfully implement on-the-fly trimming. Such a system may overcome the lack of a reliable, known reference frequency that matches that frequency used in production or production test. Furthermore, by using ratio η1 the system may take into account package stresses that would otherwise change the frequency response of the system components such as a DUT. In addition, by using ratio η2 the system may take into account temperature response changes that would otherwise change the frequency response of the system components. Also, the system can perform efficiently depending upon the necessary context. For example, during production or production test when many units in a row are to be processed, the long amount of time to start up a DUT, wait for an oscillator to warm up or settle, or wait for other elements (such as memory or processors of a microcontroller including the oscillator or DUT) may be expensive when aggregated together. Accordingly, during production or production test, the response of the DUT might not be used and instead the reference frequency applied and the resulting digital code stored. Later, when an end user uses the DUT, the several milliseconds needed to start up a DUT, wait for an oscillator to warm up or settle, or wait for other elements (such as memory or processors of a microcontroller including the oscillator or DUT) may be acceptable given that a single such DUT needs to come online. Testing of DUT and making subsequent adjustments over even thousands of cycles may be acceptable within the use case of the end user, who might need to only trim a limited number of such DUTs. Given an external reference to an SC network for a given frequency, the digital code that is stored is applicable to the same SC network when evaluating any other frequency source that is supposed to be of the same frequency. For example, an 8 MHz source will produce a digital code M0. Later, M0 may be used to validate and trim a real-world DUT that is supposed to have a frequency of 8 Mhz by using M0 on the same SC network, ADC, and RTEST.

The system that operates its circuits according to FIGS. 1-4 may experience performance advantages over other systems. Consider the example other system that, before packaging, may perform a DUT test at 25° C., correcting to a known frequency. This may take as long as 8 ms, including several thousand cycles for the DUT to settle. The DUT test may be repeated for 85° C., correcting to the known frequency. This may also take as long as 8 ms. After packaging, at 25° C., the DUT test may be repeated, correcting to the known frequency. This trim steps may require that, during production or production test, the tester has to wait for oscillator to start and become stable.

Figure 5:
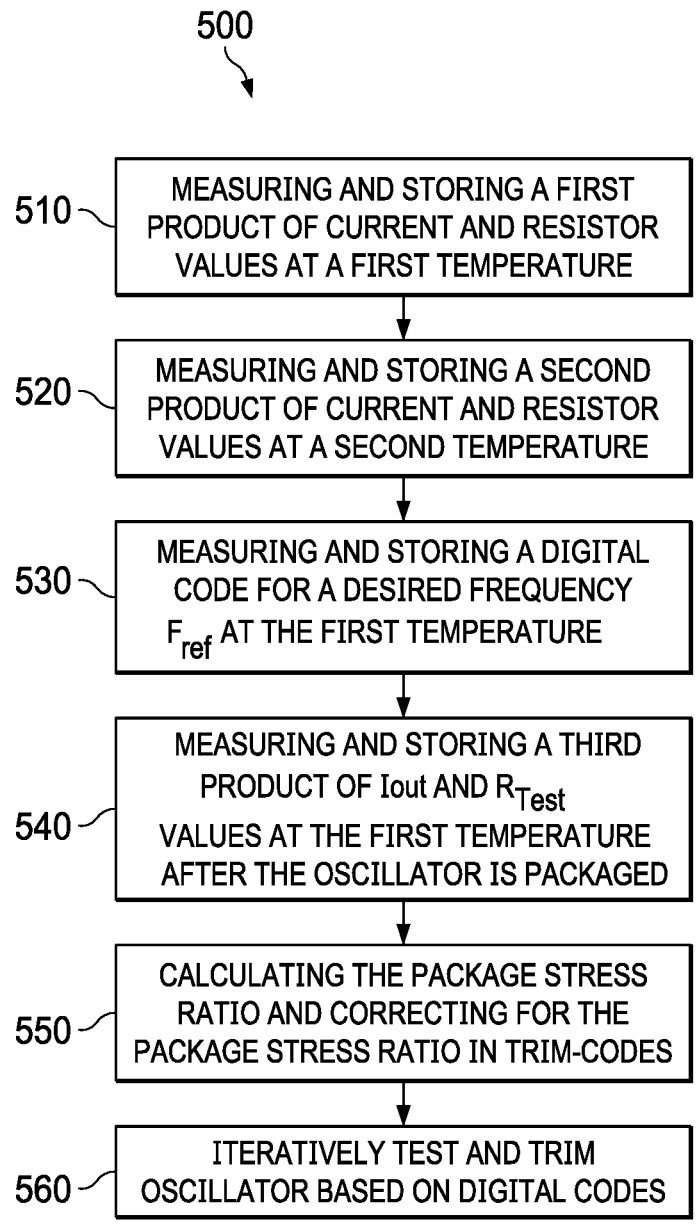
FIG. 5 is an example flow chart illustrating a method for oscillator trimming, per embodiments of the present disclosure.

The system that operates its circuits according to FIGS. 1-4 may overcome problems of such a long wake-up and settling time for RC oscillators. The system might not run a DUT test during production or production test and thus not wait for RC oscillators to settle. Instead, the system may store the digital codes of the particular SC network, ADC, and RTEST. Before packaging, at 25° C., the voltage value may be measured and stored for the known reference frequency source. This may be repeated at 85° C. The ratio of the two may define a frequency shift due to temperature. This may be repeated with the voltage from PTAT current sources to get PTAT correction information. After packaging, the digital code of the reference frequency source may be stored again to account for changes in frequency response caused by stresses of packaging. These may be accomplished in as short of a time as 80 microseconds FIG. 5 is an example flow chart illustrating a method 500 for oscillator trimming, according to embodiments of the present disclosure. In step 510, the circuit system measures and stores a first product of current and resistor values at a first temperature. The first temperature may, for example, be 25° C.

In step 520, the circuit system measures and stores a second product of current and resistor values at a second temperature. The second temperature may, for example, be 85° C. or another temperature that is different from the first temperature. The circuit system may calculate a ratio that gives the frequency shift in fosc due to temperature. The circuit system may repeat steps 510 and 520 with a variable current input IPTAT to get PTAT correction information such as the PTAT ratio n2.

In step 530, the circuit system measures and stores a digital code for the desired frequency Fref. For example, the circuit system may obtain the digital code for the desired frequency Fref at 25° C. before the oscillator is installed or packaged.

In step 540, the circuit system measures and stores a digital code corresponding to the product of Iout and RTEST. After the oscillator is packaged, the circuit system obtains a second digital code corresponding to the product of Iout and RTEST at 25° C.

In step 550, the circuit system calculates the package stress ratio and correct the package stress ratio in trim-codes. For example, the circuit system may correct the frequency of the DUT output by using the stored digital codes and the corrected package stress ratio.

In step 560, the circuit system may iteratively measure the frequency of an oscillator under test and adjust or trim the frequency based upon differences between the oscillator and known values stored from the steps above. Furthermore, the oscillator frequency may be adjusted based upon temperature and stress ratios.

Additionally, between steps 520 and 530, the system may measure two voltage signals when IPTAT is input to the IPTAT into RTEST (such as in FIG. 3) at two different temperatures. The circuit system may obtain the PTAT correction information accordingly.

The proposed integrated circuit may be used for automotive safety applications when it is essential to meet the requirements of stability and avoid over driving the crystal. Further, the proposed integrated circuit may be used across multiple computing device divisions and/or platforms, including without limitation: 16-bit and/or 32-bit microcontrollers; portable device platforms such as Windows Portable Devices (WPD) and/or Wearable Smart Gateway; and the like.

Although a specific number and sequence of steps of method 400 are shown, more or fewer steps may be taken. Furthermore, the steps of method 400 may be rearranged and conducted in other suitable orders. One or more steps of method 400 may be repeated, omitted, or executed in parallel or with each other. One or more steps of method 400 or method 400 may be executed recursively. Method 400 may begin at any suitable point, such as at step 402.

Method 500 may be implemented as instructions for execution by a processor that are embodied in one or more computer-readable media such as a memory. The instructions, when loaded and executed by the processor, may cause the microcontroller or processor to implement the functionality of the present disclosure.

Although a specific number and sequence of steps of method 500 are shown, more or fewer steps may be taken. Furthermore, the steps of method 500 may be rearranged and conducted in other suitable orders. One or more steps of method 500 may be repeated, omitted, or executed in parallel or with each other. One or more steps of method 500 or method 400 may be executed recursively. Method 500 may begin at any suitable point, such as at step 510.

Method 500 may be implemented as instructions for execution by a processor that are embodied in one or more computer-readable media such as a memory. The instructions, when loaded and executed by the processor, may cause the microcontroller or processor to implement the functionality of the present disclosure.

Method 500 may be implemented by any suitable mechanism, such as the elements of FIGS. 1-4.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

We claim:

1. An integrated circuit, comprising:
a frequency test circuit;
a device-under-test (DUT) having an input; and
a calculation engine circuit configured to:
   compare a measured frequency from the frequency test circuit measured from the DUT input to a reference frequency value stored in memory; and
   based on the comparison, adjust a frequency of the DUT generating the DUT input;
   wherein the frequency test circuit comprises a test resistor to which a test current can be applied and the calculation engine circuit is further configured to adjust frequency of the DUT based upon a predefined stress ratio stored in memory reflecting a status of the integrated circuit before and after packaging;
   wherein to calculate said predefined stress ratio the calculation engine circuit is further configured to:
      measure and store a first digital code for a desired frequency at a first temperature before packaging and a second digital code corresponding to a product of the test current and a resistance of the test resistor at the first temperature after packaging; and
      obtain the predefined stress ratio by dividing the first digital code by the second digital code or vice versa.

2. The integrated circuit of claim 1, wherein:
the frequency test circuit includes one or more switches and a capacitor; and
the frequency test circuit is configured to operate the one or more switches according to a an operating frequency of the DUT.

3. The integrated circuit of claim 1, wherein:
the integrated circuit further includes an analog-to-digital converter (ADC);
the frequency test circuit includes one or more switches and a capacitor;
the frequency test circuit is configured to operate the one or more switches according to frequency of the DUT input;
the frequency test circuit is configured to output a voltage resulting from operation of the one or more switches according to frequency of the DUT input, the voltage output resulting from operation of the one or more switches to the ADC; and the ADC is configured to output the measured frequency from a conversion of the voltage resulting from operation of the one or more switches.

4. The integrated circuit of claim 1, wherein the calculation engine circuit is further configured to determine a temperature ratio by measuring and storing a first product of current and resistance values of said test resistor at the first temperature and a second product of current and resistor values of said test resistor at a second temperature different from the first temperature.

5. The integrated circuit of claim 1, wherein the calculation engine circuit is further configured to adjust frequency of the DUT based upon a temperature ratio stored in memory reflecting a temperature performance curve.

6. The integrated circuit of claim 1, further comprising:
a reference frequency input receiving the reference frequency value; and
a multiplexer configured to select between the DUT input and the reference frequency input to be applied to the frequency test circuit, wherein for determining the reference frequency value the integrated circuit controls the multiplexer to select the reference frequency input.

7. The integrated circuit of claim 6,
wherein when the reference frequency input is selected, the frequency test circuit is configured to store a resulting measurement to memory.

8. The integrated circuit of claim 1, further comprising:
a reference frequency input receiving the reference frequency value; and
a multiplexer configured to select between the DUT input and the reference frequency input to be applied to the frequency test circuit;
wherein the frequency test circuit is configured to store a resulting reference frequency value to memory based upon a selection of the reference frequency input.

9. The integrated circuit of claim 1, further comprising:
a reference frequency input receiving the reference frequency value; and
a multiplexer configured to select between the DUT input and the reference frequency input to be applied to the frequency test circuit;
wherein the frequency test circuit is configured to provide a resulting measurement of the DUT input to the calculation engine circuit based upon a selection of the DUT input.

10. A microcontroller, comprising:
a frequency test circuit comprising a test resistor to which a test current can be applied;
a device-under-test (DUT) having an input; and
a calculation engine circuit configured to:
compare a measured frequency from the frequency test circuit measured from the DUT input to a reference frequency value stored in memory; and
based on the comparison, adjust frequency of the DUT generating the DUT input;
wherein the calculation engine circuit is further configured to adjust frequency of the DUT based upon a stress ratio stored in memory reflecting a status of the microcontroller before and after packaging;
wherein to calculate said stress ratio the calculation engine circuit is further configured to:
measure and store a first digital code for a desired frequency at a first temperature before packaging and a second digital code corresponding to a product of the test current and a resistance of the test resistor at the first temperature after packaging; and
obtain the stress ratio by dividing the first digital code by the second digital code or vice versa.

11. The microcontroller of claim 10, wherein:
the frequency test circuit includes one or more switches and a capacitor; and
the frequency test circuit is configured to operate the one or more switches according to an operating frequency of the DUT.

12. The microcontroller of claim 10, wherein:
the microcontroller further includes an analog-to-digital converter (ADC);
the frequency test circuit includes one or more switches and a capacitor;
the frequency test circuit is configured to operate the one or more switches according to frequency of the DUT input;
the frequency test circuit is configured to output a voltage resulting from operation of the one or more switches according to frequency of the DUT input, the voltage output resulting from operation of the one or more switches to the ADC; and
the ADC is configured to output the measured frequency from a conversion of the voltage resulting from operation of the one or more switches.

13. The microcontroller of claim 10, wherein the calculation engine circuit is further configured to determine a temperature ratio by measuring and storing a first product of current and resistance values of said test resistor at the first temperature and a second product of current and resistor values of said test resistor at a second temperature different from the first temperature.

14. The microcontroller of claim 10, wherein the calculation engine circuit is further configured to adjust frequency of the DUT based upon a temperature ratio stored in memory reflecting a temperature performance curve.

15. The microcontroller of claim 10, further comprising:
a reference frequency input receiving the reference frequency value; and
a multiplexer configured to select between the DUT input and the reference frequency input to be applied to the frequency test circuit, wherein for determining the reference frequency value the microcontroller controls the multiplexer to select the reference frequency input.

16. The microcontroller of claim 15,
wherein when the reference frequency input is selected, the frequency test circuit is configured to store a resulting measurement to memory.

17. The microcontroller of claim 16, further comprising:
wherein the resulting measurement corresponds to the reference frequency value and the frequency test circuit is configured to store the resulting measurement of the reference frequency value to memory based upon the selection of the reference frequency input.

18. The microcontroller of claim 10, further comprising:
a reference frequency input receiving the reference frequency value; and
a multiplexer configured to select between the DUT input and the reference frequency input to be applied to the frequency test circuit;
wherein the frequency test circuit is configured to provide a resulting measurement of the DUT input to the calculation engine circuit based upon a selection of the DUT input.

19. A method, comprising:

selecting an input mode of an integrated circuit, the integrated circuit operable in the input mode to store reference frequencies and wherein the integrated circuit comprises a test resistor to which a test current can be applied;

applying a reference frequency to a frequency test circuit of the integrated circuit;

measuring a resulting frequency from the frequency test circuit; and storing a first digital code representing the resulting frequency at a first temperature to memory of the integrated circuit before packaging;

adjusting frequency of an integrated oscillator based upon a predefined stress ratio stored in memory reflecting a status of the integrated circuit before and after packaging;

wherein the predefined stress ration is calculated by:
applying the test current to the test resistor;
measuring and storing a second digital code corresponding to a product of the test current and a resistance of the test resistor at the first temperature after packaging; and
obtaining the predefined stress ratio by dividing the first digital code by the second digital code or vice versa.

20. The method of claim 19, further comprising:

determining a temperature ratio by measuring and storing a first product of current and resistor values of said test resistor at the first temperature and a second product of current and resistor values of said test resistor at a second temperature different from the first temperature.

21. The microcontroller according to claim 10, wherein the DUT is an integrated oscillator.

22. The microcontroller according to claim 10, wherein the calculation engine circuit comprises:

a first controllable switch coupled between a voltage reference and a first terminal of a capacitor whose second terminal is coupled with ground;

a second controllable switch coupled between the first terminal of the capacitor and an input of an analog-to-digital converter.

\* \* \* \* \*